US011584640B2

United States Patent
Steuer et al.

(10) Patent No.: US 11,584,640 B2
(45) Date of Patent: Feb. 21, 2023

(54) METHOD FOR PRODUCING A MICROMECHANICAL DEVICE HAVING INCLINED OPTICAL WINDOWS, AND CORRESPONDING MICROMECHANICAL DEVICE

(71) Applicant: Robert Bosch GmbH, Stuttgart (DE)

(72) Inventors: Benjamin Steuer, Waldenbuch (DE); Stefan Pinter, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 78 days.

(21) Appl. No.: 16/968,358

(22) PCT Filed: Mar. 7, 2019

(86) PCT No.: PCT/EP2019/055747
§ 371 (c)(1),
(2) Date: Aug. 7, 2020

(87) PCT Pub. No.: WO2019/214867
PCT Pub. Date: Nov. 14, 2019

(65) Prior Publication Data
US 2020/0391998 A1    Dec. 17, 2020

(30) Foreign Application Priority Data
May 9, 2018 (DE) .................... 10 2018 207 201.9

(51) Int. Cl.
*B81C 1/00* (2006.01)
*B81B 7/00* (2006.01)

(52) U.S. Cl.
CPC ........ *B81C 1/00317* (2013.01); *B81B 7/0067* (2013.01); *B81B 2201/042* (2013.01)

(58) Field of Classification Search
CPC .......................... B81C 1/00317; B81B 7/0067
See application file for complete search history.

(56) References Cited

U.S. PATENT DOCUMENTS 8,699,115 B2    4/2014 Pinter et al.
9,663,351 B2    5/2017 Armbruster et al.
(Continued)

FOREIGN PATENT DOCUMENTS

CN          102530838 A      7/2012
DE      102008040528 A1      1/2010
(Continued)

OTHER PUBLICATIONS

International Search Report for PCT/EP2019/055747, dated May 24, 2019.

*Primary Examiner* — Benjamin P Sandvik
(74) *Attorney, Agent, or Firm* — Norton Rose Fulbright US LLP; Gerard Messina

(57) ABSTRACT

A method for producing a micromechanical device having inclined optical windows, and a corresponding micromechanical device are described. The production method includes: providing a first substrate having a front side and a rear side; forming a plurality of spaced-apart through holes in the first substrate which are arranged along a plurality of spaced-apart rows in the first substrate; forming a respective continuous beveled groove along each of the rows, the grooves defining a seat for the inclined optical windows; and inserting the optical windows into the grooves above the through holes.

10 Claims, 4 Drawing Sheets

(56) References Cited

U.S. PATENT DOCUMENTS

| | | | |
|---|---|---|---|
| 10,752,500 B2* | 8/2020 | Quenzer | B81C 1/00634 |
| 2012/0140306 A1 | 6/2012 | Pinter | |
| 2014/0376089 A1 | 12/2014 | Haberer | |
| 2015/0232328 A1 | 8/2015 | Armbruster et al. | |
| 2017/0113922 A1 | 4/2017 | Huang et al. | |
| 2018/0065845 A1 | 3/2018 | Steuer et al. | |
| 2021/0198102 A1* | 7/2021 | Pinter | B81C 1/00317 |

FOREIGN PATENT DOCUMENTS

| | | |
|---|---|---|
| DE | 102010062118 A1 | 5/2012 |
| DE | 102012206858 A1 | 10/2013 |
| DE | 102013211886 A1 | 12/2014 |
| DE | 102014202830 A1 | 8/2015 |
| DE | 102016216918 A1 | 3/2018 |
| EP | 1688766 A2 | 8/2006 |
| EP | 1748029 A2 | 1/2007 |

* cited by examiner

METHOD FOR PRODUCING A MICROMECHANICAL DEVICE HAVING INCLINED OPTICAL WINDOWS, AND CORRESPONDING MICROMECHANICAL DEVICE

FIELD

The present invention relates to a method for producing a micromechanical device having inclined optical windows and a corresponding micromechanical device.

BACKGROUND INFORMATION

Although there are any number of applicable optical devices and systems, optical micromechanical micro-mirror scanning devices will be used to explain the present invention and the problem which it seeks to solve.

Micromechanical MEMS components must be protected against damaging external environmental influences (e.g., moist, aggressive media, etc.). They also require protection against mechanical contact/destruction and protection to allow them to be separated into individual chips from a wafer composite by sawing. In many cases, a particular atmosphere (e.g., a type of gas and/or a gas pressure) must also be established through hermetic encapsulation.

Encapsulating MEMS components in the wafer composite using a capping wafer which has cavities and through holes is a widely used and established method. Here, a capping wafer is aligned with the wafer containing the MEMS structures and is joined together with it. The joining can be accomplished through anodic bonding or direct bonding (a connection between glass and silicon without a joint material), for example, or via eutectic joint layers or glass solders or adhesives. The MEMS component or components lie below the cavities of the capping wafer, electrical bonding pads for connecting the MEMS components to thin wires being accessible via the through holes in the capping wafer.

For optical micromechanical MEMS components (MO-EMS) such as, e.g., micro-mirrors, the protection described above is required along with a transparent window which has a high optical quality and may also have special optical coatings as well. In particular cases, through holes are also included in the caps for the purposes of making electrical connections.

When optical beams pass through the transparent window, reflections occur at the boundary surfaces. If the locally fixed reflexes of a micromechanical micro-mirror scanning device lie inside the scanning range of the micro-mirror, the intensity of the reflexes exceeds that of the projected image, thereby producing interfering effects. An anti-reflex coating on the optical window is only able to reduce the intensity of these interfering reflexes. Since the micro-mirror usually oscillates about or deflects from its rest position symmetrically, the reflex always remains inside the scanning range when the optical window is parallel to the rest position of the mirror surface and when the distance between the mirror plane and the optical window is small (this is always the case in MEMS components).

The only way to avoid an interference due to the reflexes is to divert the reflexes out of the scanning range by not allowing the optical window and the mirror surface to be parallel to one another in the undeflected state. There are two conventional ways to do this: on the one hand tilting the optical window, and on the other hand tilting the rest position of the mirror.

Inclined windows for individual chips are described in Eurpoean Patent Application No. EP 1 688 766 A1, for example. Inclined windows or other window forms for avoiding the reflexes are described in European Patent Application No. EP 1 748 029 A2 for wafer-level packaging.

According to European Patent Application No. EP 1 748 029 A2, the three-dimensional surface structures (for example inclined windows) in a wafer composite are produced from a transparent material (glass or plastic).

Methods for producing the three-dimensional structures are either very expensive or do not yield the required optical quality. Wafers having corresponding three-dimensional structures also present problems during processing, for example during wafer bonding, since the structures can be easily damaged.

Further methods for producing protective caps having inclined optical windows are described in German Patent Application Nos. DE 10 2008 040 528 A1, DE 10 2010 062 118 A1 and DE 10 2012 206 858 A1, for example.

SUMMARY

The present invention provides a method of producing a micromechanical device having inclined optical windows and a corresponding micromechanical device.

Preferred developments of the present invention are described herein.

In accordance with an example embodiment of the present invention, a plurality of spaced-apart through holes are formed in the first substrate, the holes being arranged along a plurality of spaced-apart rows in the first substrate. A continuous beveled groove is formed along each of the rows, the respective grooves defining a seat for the inclined optical windows.

The present invention thus facilitates a cost-effective method of producing a micromechanical device having an inclined optical window, the device being suitable for use for example as a protection wafer for a micromechanical micro-mirror scanning device. The inclined, transparent optical windows may be produced with a high optical quality. The production method according to the present invention is robust and suitable for high-volume production and is more cost-effective than conventional methods. The subsequent conventional processing process, using MEMS substrates, only needs slight modification.

The inclined optical windows may be produced using processes which are common in MEMS and semiconductor technologies. Scratches, particles on and damages to the inclined optical window during processing can be easily prevented.

Rectangular optical windows may be used in conjunction with the to the present invention, without a step-cut profile where appropriate. This allows the exploit per optical glass wafer to be doubled and the separation process to be simplified, which is a further cost advantage.

According to a preferred development of the present invention, adjacent grooves are beveled in opposite directions. This enables a stable substrate structure and a narrow arrangement of chips so that only one common opening is needed for electrical bonding pads of adjacent chips.

According to a further preferred development of the present invention, the optical windows are joined in a hermetically sealed manner, for example glued in, along the entire periphery of the windows. This allows for the formation of hermetically sealed windows.

According to a further development of the present invention, the grooves are formed in a mechanical grinding process. This is an efficient way of forming the grooves.

According to a further preferred development of the present invention, a second substrate is bonded to the front side after the grooves are formed, insertion openings for inserting the optical windows being formed in the second substrate. This allows for an additional protection and alignment aid for the windows as well as for further processing of the substrates, and for automatic handling, for example by edge suction.

According to a further preferred development of the present invention, the grooves and the second substrate are structured such that the optical windows are completely countersunk in the second substrate. Protection of this type is particularly effective and prevents damages to the windows by avoiding mechanical contact.

According to a further preferred development of the present invention, the insertion openings are designed as lateral guides for the optical windows. This enables secure alignment of the windows.

According to a further preferred development of the present invention, the optical windows are provided with glass solder at the peripheral edge for joining purposes, the windows then being inserted into the grooves using a pick-and-place process and subsequently hermetically joined, i.e., glued, to the substrate in the inserted state thermally by softening the glass solder. This provides a robust method suitable for high-volume production.

According to a further preferred development of the present invention, the first and/or the second substrate are wafer substrates, in particular glass wafer substrates, silicon wafer substrates, ceramic wafer substrates, metal wafer substrates or plastic wafer substrates. These kinds of substrates are stable and may be easily processed.

BRIEF DESCRIPTION OF THE DRAWINGS

Further features and advantages of the present invention are explained below with the aid of specific embodiments and with reference to the figures.

DETAILED DESCRIPTION OF EXAMPLE EMBODIMENTS

In the figures, identical reference signs indicate the same or functionally identical elements.

Figure 1A:
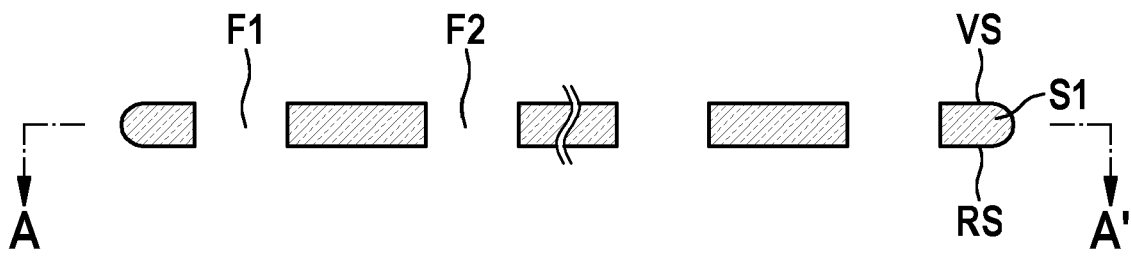
FIG. 1a)-e) show schematic cross-sectional representations for explaining a method for producing a micromechanical device having inclined optical windows and a corresponding micromechanical device according to a first specific example embodiment of the present invention.
Figure 2:
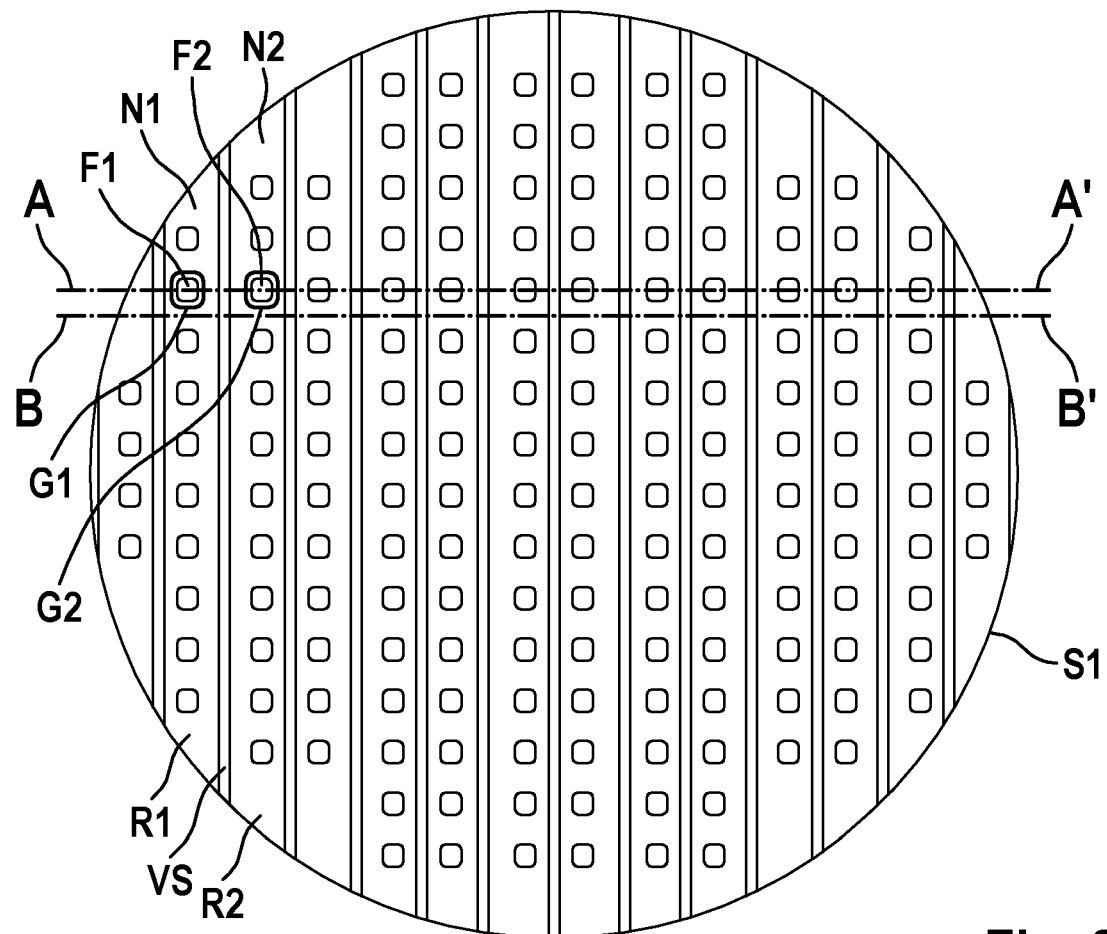
FIG. 2 shows a schematic top view of the micromechanical device according to the first specific example embodiment of the present invention.

FIGS. 1a)-1e) are schematic cross-sectional representations to explain a method for producing a micromechanical device having inclined optical windows and a corresponding micromechanical device according to a first specific example embodiment of the present invention, and FIG. 2 is a schematic top view of the micromechanical device according to the first specific example embodiment of the present invention.

The micromechanical device having inclined optical windows according to the first specific embodiment may be used as a protection wafer device for a micromechanical micromirror scanning device, for example.

The production of the micromechanical device is described at the level of the wafer even though it is not limited to this level, it being applicable to other substrate levels as well. To simplify the representation, only the production of two inclined optical windows is shown even though a large plurality of inclined optical windows can of course be produced.

In FIG. 1a), reference sign S1 identifies a first wafer substrate, for example a silicon wafer substrate or glass wafer substrate or plastic substrate or metal wafer substrate or ceramic wafer substrate, etc., FIG. 1a) corresponds to section A-A' in FIG. 2.

The first wafer substrate S1, which has a front side VS and a rear side RS, is processed in a first production step.

Through holes F1 and F2 are made in first wafer substrate S1, for example by KOH etching or sand blasting or using some other material removal method (including mechanical drilling, grinding, erosion or laser processing). Through holes F1, F2 and other through holes which are not shown are formed in parallel rows R1, R2 in a matrix on first wafer substrate S1.

Figure 1B:
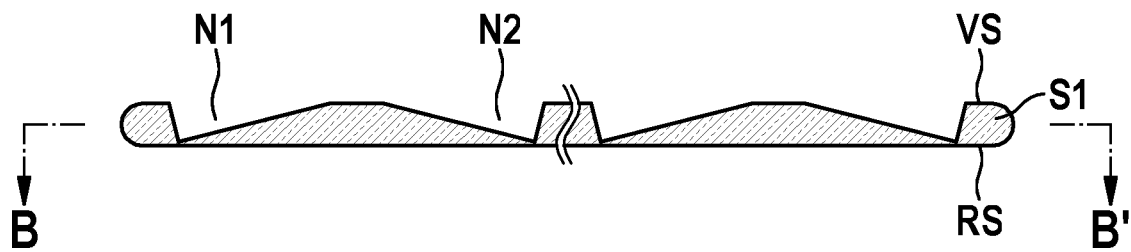

FIG. 1b) corresponds to section B-B' in FIG. 2. As shown in FIG. 1b), in a subsequent process step following the formation of through holes F1, F2 etc, continuous beveled grooves N1, N2 are formed along rows R1, R2 on the front side VS, the grooves defining a seating or sealing surface for the optical windows to be inserted later. These grooves N1, N2 can be formed by grinding using a matching profile, for example. In the present example, the bevel angle—relative to the normal of the first wafer substrate S1—is 60°, but in principle any angle may be selected depending on the application. Here, each groove N1, N2 runs along a respective row of through holes F1, F2. Adjacent grooves N1, N2 are preferred to be beveled in opposite directions as shown in FIG. 1b).

Figure 1C:
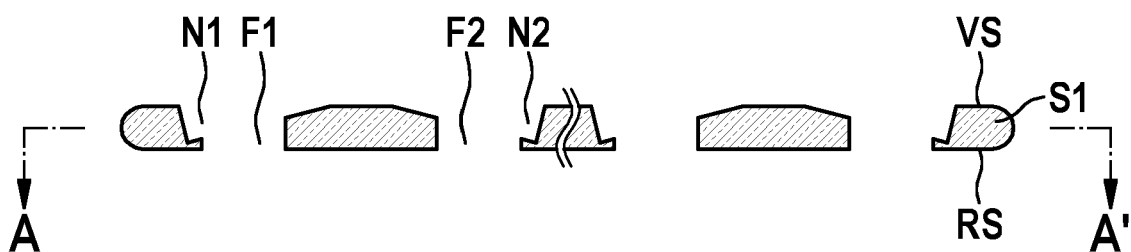
Figure 1D:
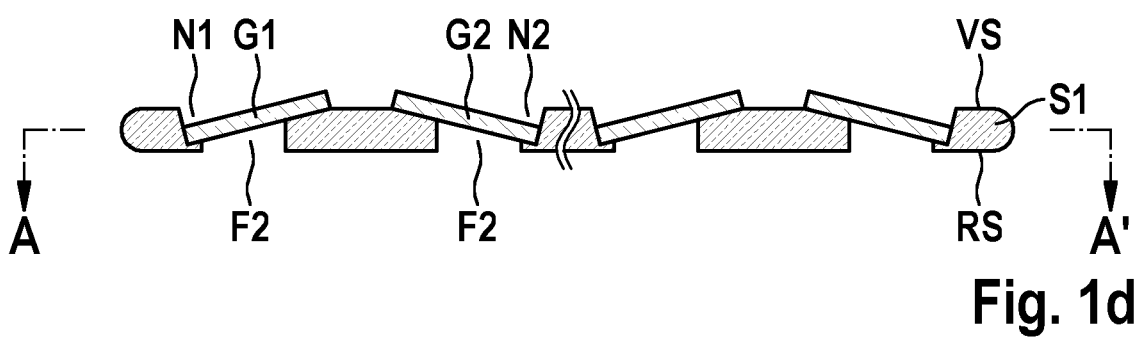

FIG. 1c) corresponds to section A-A' in FIG. 2 and shows grooves N1, N2 together with through holes F1, F2. FIG. 1d) corresponds to section A-A' in FIG. 2.

As shown in FIG. 1d), optical windows G1, G2, which had previously been provided with glass solder along their entire periphery, are inserted and joined in a hermetically sealed fashion using a pick-and-place placement method (chip-to-wafer fabrication). After inserting optical windows G1, G2, the first wafer substrate, which is completely equipped with optical windows G1, G2, is heated on a hot plate (not shown) and upon reaching the softening temperature of the glass solder, optical windows G1, G2 are pressed into their respective seats by way of a pressure difference between the front side VS and the rear side RS. This causes the glass solder located between optical windows G1, G2 and the first wafer substrate S1 to soften and flow. After subsequent cooling, a hermetic bond is established between optical windows G1, G2 and the first wafer substrate.

Figure 1E:
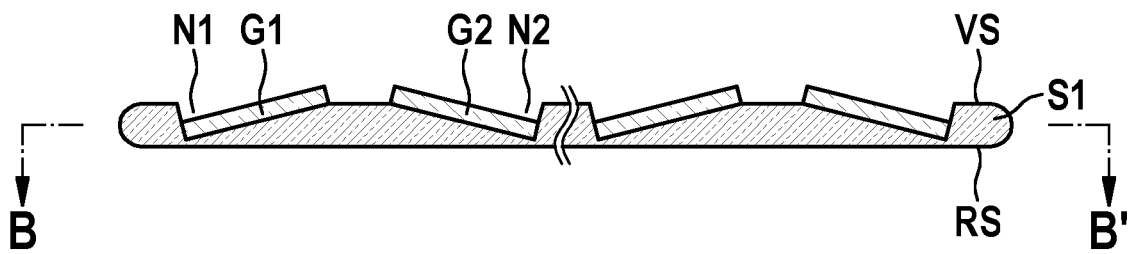

FIG. 1e) corresponds to section B-B' in FIG. 2.

The production of the protection wafer is concluded in the latter process step. To form a hermetic composite comprising an actuator or sensor wafer, glass solder is also applied to the rear side RS of the first wafer substrate S1 (not shown), for example.

The production of such a wafer composite comprising a MEMS wafer is carried out using common wafer composite processes and wafer composite facilities. Here, a vacuum or overpressure relative to ambient may be established in the cavities between the first wafer substrate and the actuator or sensor wafer (not shown). Also, the final separation of the chips is done using a standard process such as sawing.

Figure 3A:
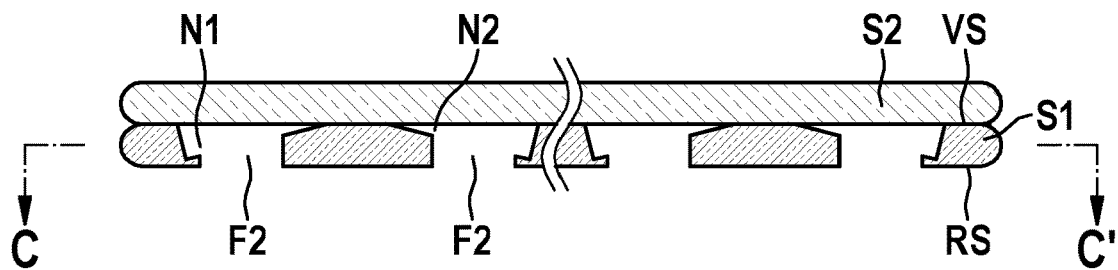
FIG. 3a)-d) show schematic cross-sectional representations for explaining a method for producing a micromechanical device having inclined optical windows and a corresponding micromechanical device according to a second specific example embodiment of the present invention.
Figure 3B:
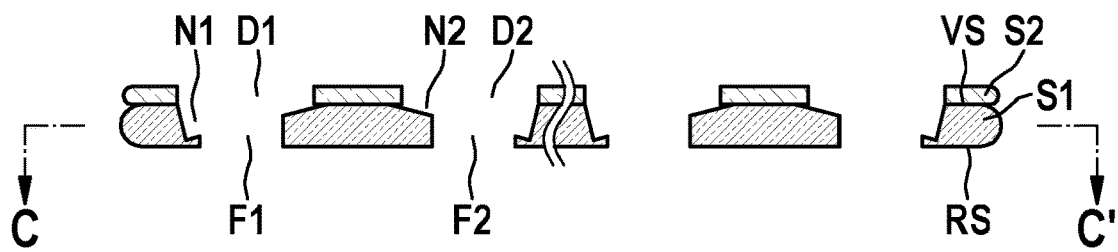
Figure 4:
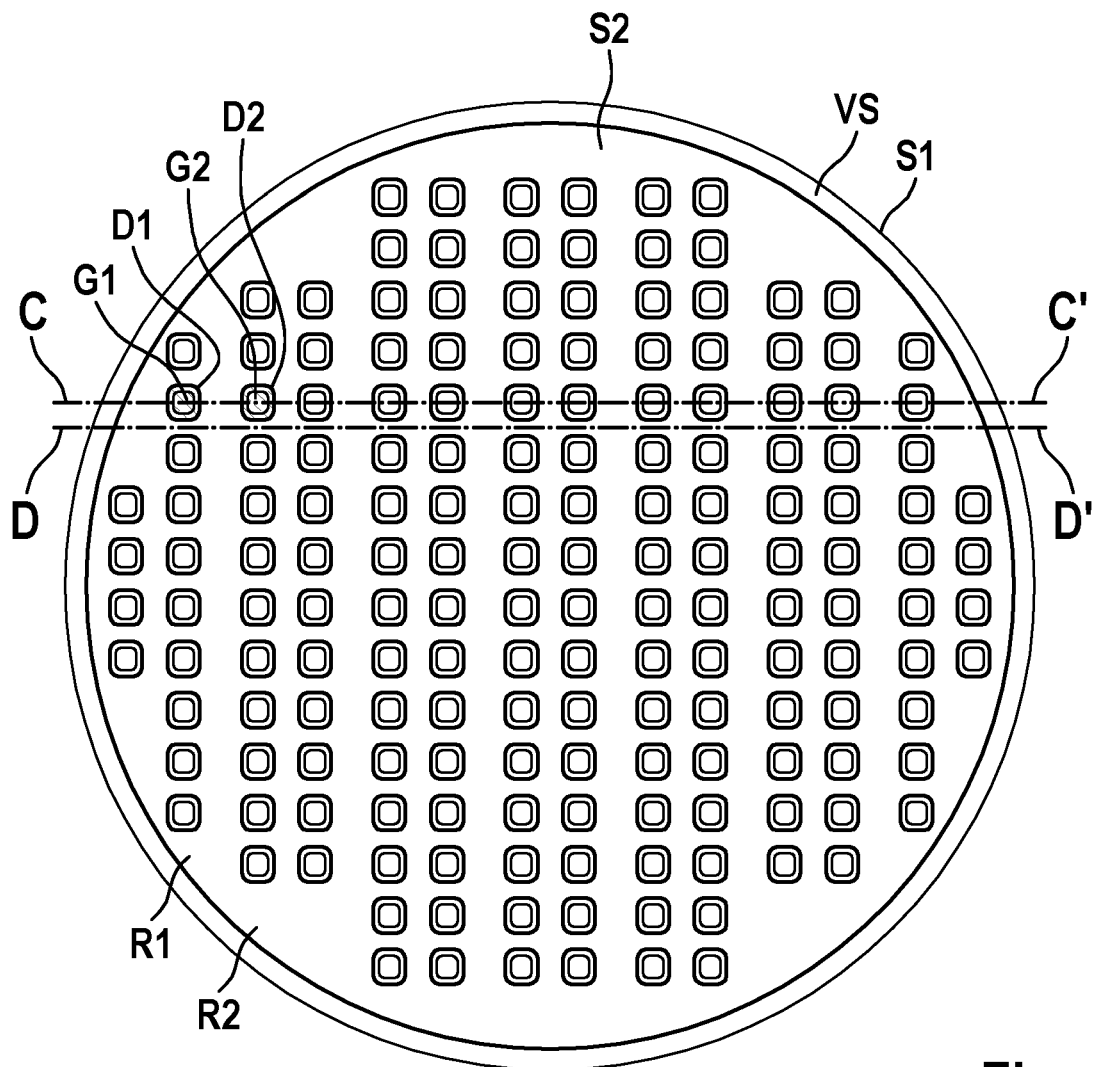
FIG. 4 show a schematic top view of the micromechanical device according to the second specific embodiment of the present invention.

FIG. 3a)-d) are schematic cross-sectional representations for explaining a method for producing a micromechanical device having inclined optical windows and a corresponding micromechanical device according to a second specific example embodiment of the present invention, and FIG. 4 is a schematic top view of the micromechanical device according to the second specific example embodiment of the present invention.

Figure 3C:
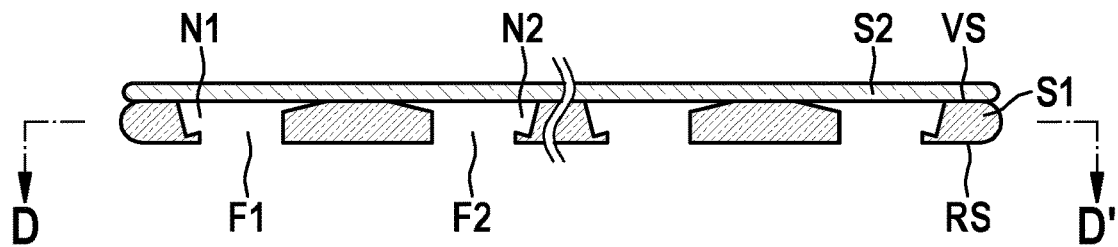

FIGS. 3a), 3b), 3c) correspond to section C-C' in FIG. 4. FIG. 3c) corresponds to section D-D' in FIG. 4.

The process state according to FIG. 3a) follows upon the process state according to FIG. 1c). A second wafer substrate S2 is bonded to the front side VS of the first wafer substrate S1. Second wafer substrate S2 may already have been thinned to its final target thickness at this time and may also have insertion openings D1, D2 for optical windows G1, G2. The thinning and the forming of insertion openings D1, D2 for glass windows G1, G2 can be performed, based on the process setup, for example using KOH etching, sand blasting, mechanical grinding, trench etching, etc., or by combinations of these structuring methods.

However, in the present exemplary embodiment, second wafer substrate S2 is first bonded to first wafer substrate S1 and then thinned to its final target thickness, whereupon insertion openings D1, D2 are made for inserting optical windows G1, G2.

Figure 3D:
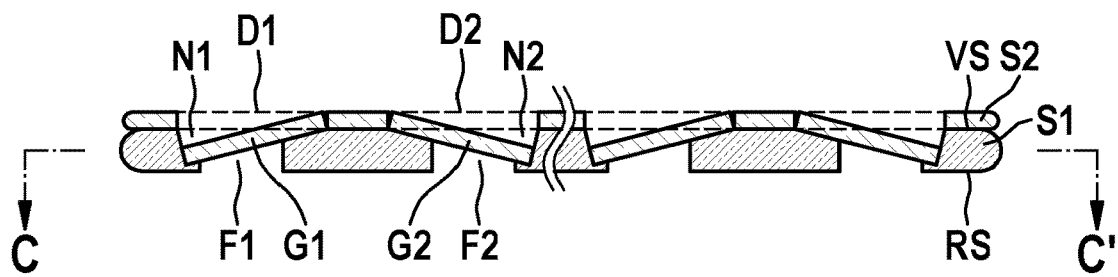

The depth of grooves N1, N2 and the thickness of second wafer substrate S2 are preferably selected such that optical windows G1, G2 are completely countersunk relative to the exposed surface of second wafer substrate S2. This makes it possible to ensure that optical windows G1, G2 are not damaged after they are inserted, i.e., that for example scratches due to mechanical effects are avoided. Preferably, insertion openings D1, D2 are designed as lateral guides for optical windows G1, G2. Such lateral guiding prevents optical windows G1, G2 from slipping out of place inside insertion openings D1, D2 as shown in FIG. 3d).

As described above in connection with FIG. 1d), optical windows G1, G2, which had been previously provided peripherally with glass solder, are inserted using a pick-and-place placement method, followed by the glass softening temperature step.

The use of second wafer substrate S2 facilitates a structure-free edge of first wafer substrate S1 and also provides a peripheral joint surface on the chips. Grooves N1, N2 can thus extend across the entire wafer diameter up to the edge, which is very advantageous from a manufacturing perspective since grinding wheels with a large diameter can be used, for example. This is very advantageous for the removal rate and for the precision of the profile of grooves N1, N2. As described above, adjacent grooves N1, N2 are preferably beveled in opposite directions.

Further processing of the protection wafer thus produced may proceed as described above in connection with the first specific embodiment.

Although the present invention is described herein using preferred exemplary embodiments, it is not limited thereto. In particular, the materials and topologies mentioned are only exemplary and are not limited to the examples explained.

In particular, other inclination directions, angles, geometries, etc., may be selected.

If only one substrate S1 is used, the optical windows may also be placed into the groove and joined as continuous strips.

What is claimed is:

1. A method for producing a micromechanical device having inclined optical windows, comprising the following steps:

providing a first substrate having a front side and a rear side;

forming a plurality of spaced-apart through holes in the first substrate which are arranged along a plurality of spaced-apart rows in the first substrate;

forming a respective continuous beveled groove along each of the rows, the grooves defining a seat for the inclined optical windows;

inserting the optical windows into the grooves above the through holes, wherein adjacent one of the grooves are beveled in opposite directions, and after the forming of the grooves, bonding a second substrate to the front side; wherein insertion openings for inserting the optical windows are formed in the second substrate, wherein the grooves and the second substrate are structured such that the optical windows are completely countersunk in the second substrate and at least a portion of the optical windows adjoin the second substrate.

2. The production method as recited in claim 1, wherein the optical windows are joined in a hermetically sealed manner along an entire periphery of the optical windows.

3. The production method as recited in claim 1, wherein the grooves are formed in a mechanical grinding process.

4. The production method as recited in claim 1, wherein the insertion openings are configured as lateral guides for the optical windows.

5. The production method as recited in claim 1, wherein the optical windows are provided with glass solder peripherally at an edge for joining, the optical windows then being inserted into the grooves using a pick-and-place process, the optical windows being joined in a hermetically sealed manner in an inserted state thermally by softening the glass solder.

6. The production method as recited in claim 1, wherein the first substrate is a wafer substrate, the wafer substrate being a glass wafer substrate, or a silicon wafer substrate, or a ceramic wafer substrate, or a metal wafer substrate, or a plastic wafer substrate.

7. The production method as recited in claim 1, wherein the second substrate is a wafer substrate, the wafer substrate being a glass wafer substrate, or a silicon wafer substrate, or a ceramic wafer substrate, or a metal wafer substrate, or a plastic wafer substrate.

8. A micromechanical device having inclined optical windows, comprising:

a first substrate having a front side and a rear side;

a plurality of spaced-apart through holes in the first substrate which are arranged along a plurality of spaced-apart rows in the first substrate;

a respective continuous beveled groove along each of the rows, the grooves defining a seat for the inclined optical windows; and a plurality of optical windows which are inserted into the grooves in a hermetically sealed manner above the through holes, wherein adjacent ones of the grooves are beveled in opposite directions,
and
wherein a second substrate is bonded to the front side and wherein insertion openings for inserting the optical windows are formed in the second substrate,
wherein the grooves and the second substrate are structured such that the optical windows are completely countersunk in the second substrate and at least a portion of the optical windows adjoin the second substrate.

9. The micromechanical device as recited in claim 8, wherein the optical windows are joined in a hermetically sealed manner along an entire periphery of the optical windows.

10. The micromechanical device as recited in claim 8, wherein the insertion openings are lateral guides for the optical windows.

* * * * *